(12) United States Patent
Gawa et al.

(10) Patent No.: US 6,285,000 B1
(45) Date of Patent: Sep. 4, 2001

(54) LASER PROCESSING DEVICE (75) Inventors: Tomohiro Gawa, Hirakata; Akira Wada, Yawata; Ken Muneyuki; Souji Yamamoto, both of Neyagawa; Masahiro Kawata, Toyonaka; Akiko Nakamura, Yawata; Kenji Kasai, Toyonaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/467,258

(22) Filed: Dec. 20, 1999

Related U.S. Application Data (62) Division of application No. 09/005,375, filed on Jan. 9, 1998, now Pat. No. 6,090,330.

(30) Foreign Application Priority Data

Feb. 6, 1997 (JP) .................................................... 9-023081
Feb. 27, 1997 (JP) .................................................... 9-044097

(51) Int. Cl.[7] .................................................... B23K 26/00
(52) U.S. Cl. ................................. 219/121.7; 219/121.82; 219/121.84
(58) Field of Search .......................... 219/121.28, 121.58, 219/121.7, 121.82, 121.84; 264/400

(56) References Cited

U.S. PATENT DOCUMENTS 3,877,334 * 4/1975 Gerber ...................................... 83/22
5,883,357 * 3/1999 Newman et al. ............... 219/121.67

* cited by examiner

Primary Examiner—Samuel M. Heinrich
(74) Attorney, Agent, or Firm—Jordan and Hamburg LLP (57) ABSTRACT

The two ends of an article to be processed which is in the form of a sheet are held by means of a fixed clamp and a movable clamp, the article being held by applying bias by means of a biasing cylinder to the movable clamp in a direction such as would separate it from the fixed clamp and hole-forming processing being performed by means of a laser beam. Since the sheet-like article is held under tension, flatness of even a thin sheet can be maintained and since the underneath space is open, there is no reflection of laser light after passing through the holes that are formed and any processing waste can easily be removed.

6 Claims, 8 Drawing Sheets

LASER PROCESSING DEVICE

This is a division of application Ser. No. 09/005,375, filed Jan. 9, 1998 now U.S. Pat. No. 6,090,330.

BACKGROUND OF THE INVENTION

The present invention relates to a laser processing device and laser processing method whereby laser processing such as processing for the formation of minute holes is performed on an article to be processed which is in the form of a sheet, such as a circuit board, using a laser beam.

Figure 1:
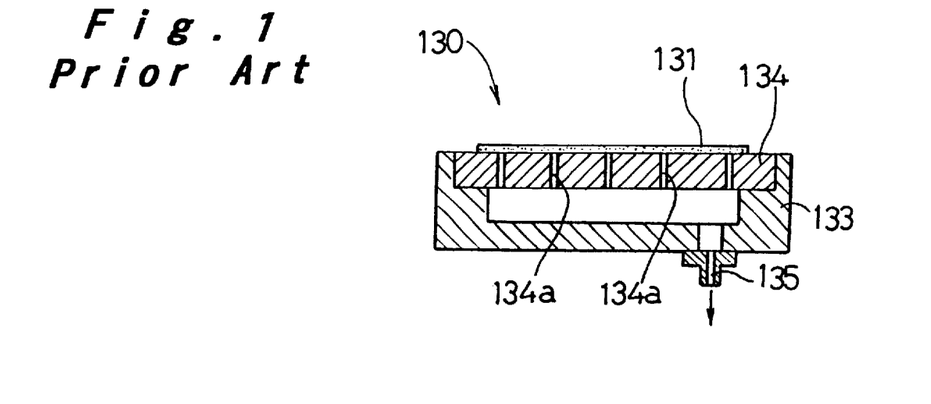
FIG. 1 is a cross-sectional view showing the construction of a prior art laser processing device.

FIG. 1 shows the construction of a holding device for an article to be processed which is in the form of a sheet in a prior art laser processing device. This laser processing device 130 is constructed so as to perform laser processing by holding a sheet-like article 131 to be processed at a prescribed position.

In FIG. 1, through-holes 134a are provided on a suction plate 134 arranged on a holding base 133. The sheet-like article 131 to be processed placed on suction plate 134 is held in a prescribed position by suction created by vacuum evacuation from vacuum evacuation port 135. Processing to produce a minute hole is achieved by directing a laser beam on to article 131 held in this prescribed position.

Figure 2:
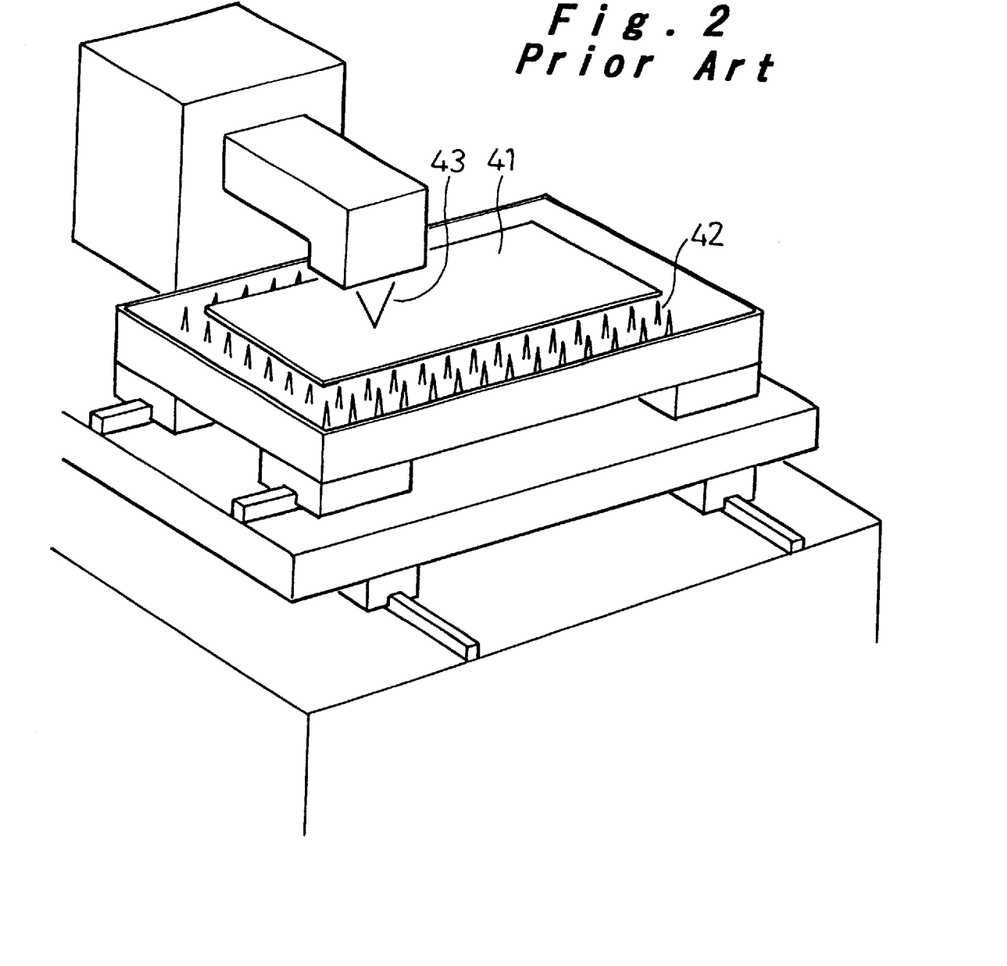
FIG. 2 is a diagrammatic perspective view showing a prior art example.

FIG. 2 shows another known $CO_2$ laser processing device for processing the surface of an article in the form of a thin sheet consisting of a metal sheet or the like at high speed and high accuracy, in which the article is located in position and a laser beam is directed on to the surface of this article. In such a laser processing device, as shown in FIG. 2, the undersurface of article 41 to be processed is supported at a large number of locations by spikes 42, leveling being achieved by utilizing the weight of this article 41 and processing being performed by directing a laser beam 43 on to article 41 from its upper surface.

However, in the prior art example shown in FIG. 1, when hole-forming processing of article 131 is performed by a laser beam, laser light passing through article 131 by means of the holes that are thus formed is reflected by suction plate 134 and this reflected light heats up and deforms article 131 to be processed. Since circuit board materials etc. are easily deformed by heat, through-holes for preventing reflection are provided, as a counter-measure, beforehand in suction plate 134 at positions corresponding to the positions in which the holes are to be formed in article 131. However, since the position of such anti-reflection through-holes is different depending on the type of article 131 to be processed, it is difficult to make these correspond with a large number of product types. Although it is possible to cope with changes in the position in which processing is effected if the antireflection through-holes are formed large enough, if article 131 to be processed is thin, distortion is produced by the suction, lowering processing accuracy. Also, since article 131 to be processed is fixed in position by vacuum suction, the residue produced by processing is removed by this suction, but there was the problem of blockages being produced by this residue in parts of the suction flow path.

Further, the prior art example shown in FIG. 2 which is employed for forming through-holes by laser processing for via electrodes in the thin resin sheet or metal sheet for multi-layer circuit boards was subject to the following problems. Specifically, thin sheet such as resin sheet has poor shape stability and is liable to curl so if this prior art method is applied to such thin sheet, large undulations are left in the vicinity of the center of the thin sheet. This gives rise to the problem that such changes in surface height may exceed the allowed range of working distance of the laser beam, making accurate processing impossible.

SUMMARY OF THE INVENTION

An object of the present invention is to provide a laser processing device and laser processing method whereby the problems of the prior art experienced when forming holes in articles to be processed in the form of a sheet by laser processing and/or the problems occurring when subjecting an article to be processed which is in the form of a thin sheet to laser processing can be solved.

In order to achieve the above object, a laser processing device according to the present invention in which hole-forming processing is performed by directing a laser beam on to an article to be processed which is in the form of a sheet comprises at least a pair of clamps that respectively hold two opposite end parts of the article to be processed, and a tensioning device that applies tension to the article to be processed by applying a bias in a direction such as would mutually separate this pair of clamps.

Also, in a method of laser processing in which hole-forming processing is performed by directing a laser beam on to an article to be processed which is in the form of a sheet, according to the present invention, in order to achieve the above object, laser processing is performed whilst applying tension to the article to be processed by applying bias in a direction such as would relatively separate two opposite end parts of the article to be processed.

With the above laser processing device and laser processing method, an article to be processed which is in the form of a sheet is held at two end parts by a pair of clamps, and tension is applied between the two end parts which are thus held. The article can thus be held in a constant flat condition without holding the back face of the portion being processed of the article being processed by a suction plate and without vacuum suction. The laser-processed surface of the article to be processed can therefore be supported suspended in space, so reflection from a suction plate of laser light passing through the holes that are formed does not occur and there is no thermal deformation due to such reflected light. Also, there is no blockage of the suction flow path by the residue produced by processing, which is a problem in a holding structure using vacuum suction. Accordingly, stable processing can be continued.

Further, a laser processing device according to the present invention, in order to achieve the above object, comprises: clamps that apply tension to an article to be processed which is in the form of a thin sheet; a suction device that applies suction and holds in releasable manner side portions at at least two locations of the periphery of a demarcation portion such that it can maintain this demarcation portion of the article to be processed which is in the form of a thin sheet in a flat condition due to this tension; a laser beam emitting device that performs laser processing of the demarcation portion of the article to be processed which is in the form of a thin sheet, which is held by suction by the suction device; and a displacement device whereby the article to be processed which is in the form of a thin sheet is displaced relatively with respect to this laser beam emission device and suction device, so that each demarcation portion of the article to be processed which is in the form of a thin sheet is successively subjected to laser processing.

Also, in order to achieve the above object, in a laser processing method wherein laser processing is performed by directing a laser beam on to an article to be processed which is in the form of a thin sheet, in which, whilst applying tension to the article to be processed which is in the form of a thin sheet, side parts at at least two locations of the periphery of a demarcation portion are supported by suction so that this demarcation portion of the article to be processed which is in the form of a thin sheet is maintained in flat condition by this tension, this demarcation portion is subjected to laser processing which is repeated for successive demarcation portions.

With the laser processing device and laser processing method of the invention as above, since the clamps tension the article being processed which is in the form of a thin sheet and the suction device applies suction and support in a tensioned condition to the side parts at at least two locations of the periphery of a demarcation portion of the article being processed, surface undulations of the thin-sheet article can be corrected and flattened within this demarcation portion, so each demarcation portion can be accurately subjected to laser processing by the laser beam emission device. Furthermore, since the thin-sheet article is divided up into a plurality of demarcation portions, each demarcation portion being successively introduced by the displacement device into the suction zone of the suction device, even thin-sheet articles that have large area and small thickness can be subjected to accurate laser processing.

Further, in order to achieve the above object, the laser processing method according to the present invention is characterized in that, when laser processing is performed to an article in the form of a thin sheet which is given tension and thus kept in a flat condition, an amount of displacement of processing points which displace when the thin sheet elongated by tension is released from the tension and shrunk resiliently is calculated and inputted into controlling data as corrected data, based on which laser processing operation is controlled.

With the laser processing method of the invention as above, the article in the form of a thin sheet which has poor shape stability can be firmly held in a flat condition by applying tension thereto, while the amount of displacement of the laser processing points which is caused by resilient shrinkage of the thin sheet having been stretched when released from the tension is preliminarily calculated according to which the data regarding processing points is corrected, whereby laser processing accuracy is further enhanced.

DESCRIPTION OF THE PREFERRED EMBODIMENTS

An embodiment of the present invention is described below with reference to the accompanying drawings. While the described embodiments represent the preferred form of the present invention, it is to be understood that modifications will occur to those skilled in the art without departing from the spirit of the invention. The scope of the invention is therefore to be determined solely by the appended claims.

Figure 3:
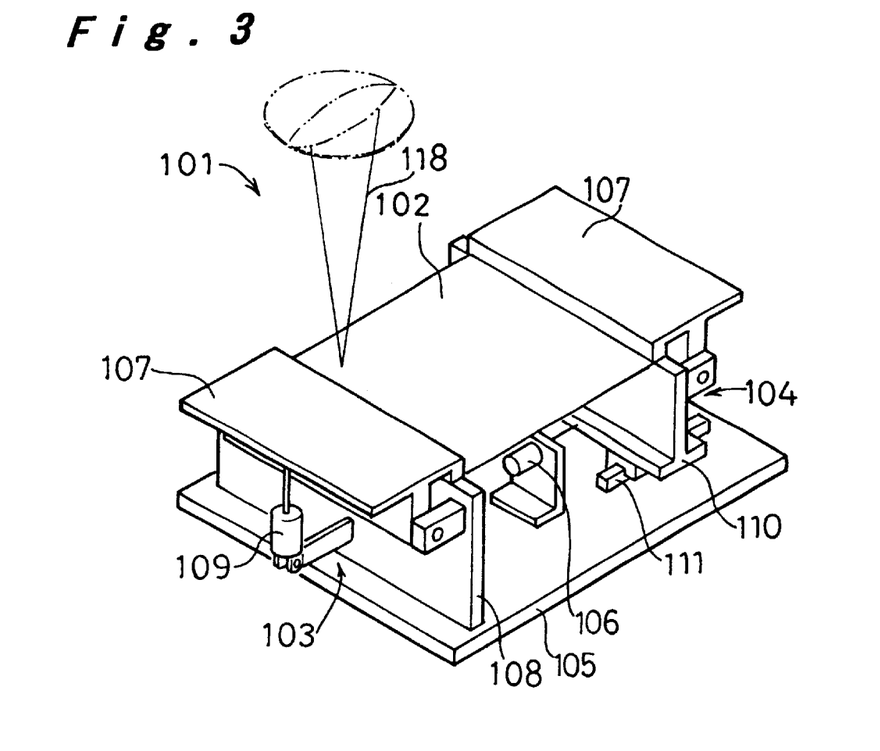
FIG. 3 is a perspective view showing the construction of a laser processing device in a first embodiment of the present invention.
Figure 4:
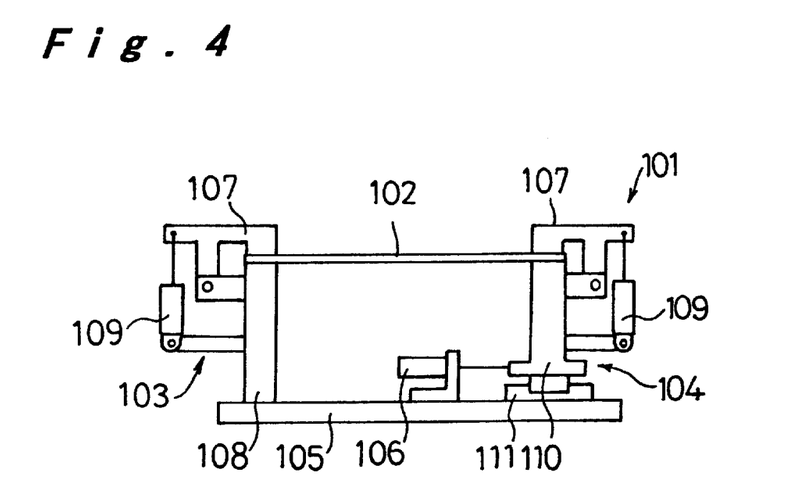
FIG. 4 is a front view showing the construction of this device.

FIG. 3 is a perspective view showing the construction of a laser processing device according to a first embodiment of the present invention and FIG. 4 is a front view of this device. Depiction of the construction of the laser beam emitting portion is omitted. The sheet-like article to be processed which is the subject of the laser processing is a circuit board consisting of a resin sheet or metal sheet. Specifically in this embodiment, the article to be processed is a thin sheet made of aramid epoxy resin.

In FIG. 3, laser processing device 101 is constituted as a processing device that forms minute through-holes in a circuit board 102 constituting the sheet-shaped article to be processed. Hole formation is achieved by directing laser beam 118 on to circuit board 102 held in a prescribed position. Circuit board 102 is held with both its ends clamped between a fixed clamp 103 fixed to base plate 105 and a movable clamp 104 mounted on a guide rail 111 mounted on base plate 105. Bias in a direction away from fixed clamp 103 is applied by movable clamp 104 by means of biasing cylinder 106, so tension is applied to the circuit board 102 whose two ends are clamped therein, so that the circuit board 102 is held while being maintained in a flat condition. The holding structure of this circuit board 102 will be described in detail with reference to FIG. 4.

In FIG. 4, clamp operating arms 107 are provided respectively at the top of fixed clamp 103 and movable clamp 104, being constructed such that they can be operated to be opened or closed by means of respective removable cylinders 109. After mounting the two end parts of circuit board 102 between clamping block 108 of fixed clamp 103 and clamping block 110 of movable clamp 104, in a condition with clamp operating arms 107 held open by means of removable cylinders 109, the two end parts of circuit board 102 are clamped by closing respective clamp operating arms 107 by means of removable cylinders 109.

Movable clamp 104 is mounted on guide rail 111 that is mounted on base plate 105 and is biased in the direction away from fixed clamp 103 by means of a biasing cylinder 106 linked to clamping block 110. When biasing cylinder 106 is driven after circuit board 102 has been held by means of respective clamp operating arms 107 of fixed clamp 103 and movable clamp 104, movable clamp 104 is biased in the direction away from fixed clamp 103 along guide rail 111, so that tension is applied to the circuit board 102 that is thus held. The biasing force produced by this biasing cylinder 106 may be a tension that is sufficient for the condition that flexing is produced in the middle of circuit board 102 supported only at both its ends to be eliminated. A sheet-form circuit board 102 that is liable to flexing, in particular even when this circuit board 102 consists of a very thin sheet, can therefore be held in a fixed flat condition.

Minute hole-forming processing can thus be accurately achieved by directing a laser beam on to a sheet-form circuit board 102 that is held at both its ends and is in a condition in which it is maintained flat by a fixed tension, at prescribed processing positions. Even if the laser beam penetrates through the hole portions that are thus formed, since a large gap is formed therebelow, reflection of the laser beam after it has passed through a through-hole can have no adverse effect on circuit board 102 and thermal distortion due to reflected light Therefore does not occur. Furthermore, residue produced by processing merely accumulates below circuit board 102, so by removing it from time to time any problems due to residue can be avoided.

Figure 5:
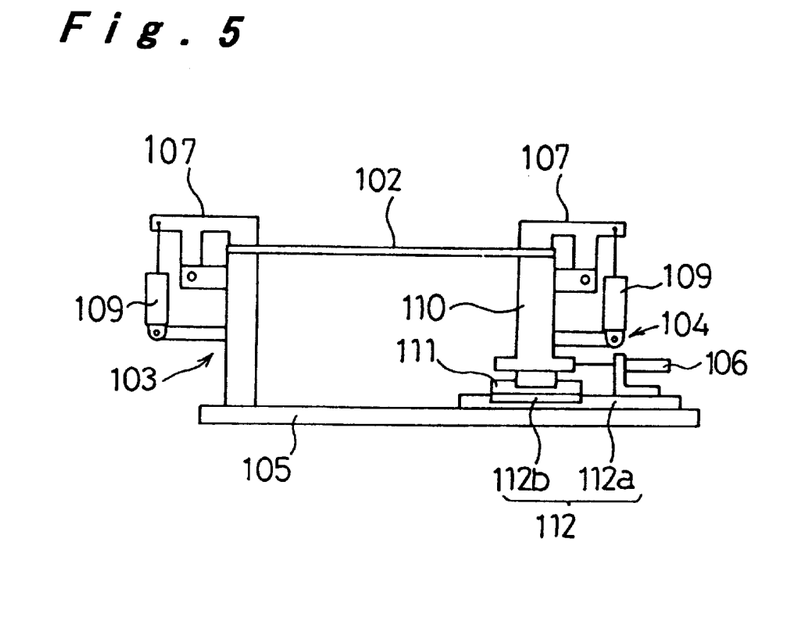
FIG. 5 is a front view showing the construction whereby size variations of the article to be processed are coped with in this device.

FIG. 5 is a front view showing a modified example of the above construction. In the above-described construction, a sheet-shaped circuit board 102 was constituted of a fixed external size, whereas changes in the external size of circuit board 102 may be coped with by mounting movable clamp 104 on a holding width adjustment unit 112 in this modified example as shown in FIG. 5. Holding width adjustment unit 112 can be constituted comprising: rail 112a that is fixed on a base plate 105, slider 112b that is capable of sliding along this rail 112a, and a means for fixing (not shown) whereby movement of this slider 112b can be fixed at a set position. By mounting movable clamp 104 on slider 112b, it is possible to adjust movable clamp 104 to match the size of a circuit board 102 to be processed. In this construction, biasing cylinder 106 is constituted such as to be capable of biasing movable clamp 104 in the tensioning direction and is arranged avoiding the space below circuit board 102, so the operation of cleaning the space below circuit board 102, in which processing residue produced by the laser processing is liable to accumulate, can be facilitated.

Figure 6:
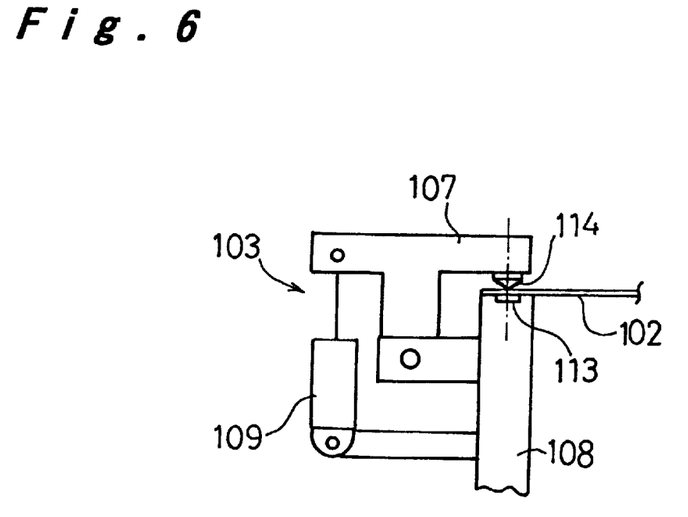
FIG. 6 is a partial front view showing a modified example of a holding structure for the article to be processed in this device.

Also, FIG. 6 is a partial front view showing a modified example of the construction of a clamping surface for a sheet-shaped circuit board 102 employing a clamp operating arm 107 and clamping block 108. Since tension is applied to both ends of circuit board 102, it needs to be securely maintained in position such that the clamping positions do not become displaced. As shown in FIG. 6, by forming a recess 113 in clamping block 108 and providing a projection 114 in clamp operating arm 107 opposite to this recess 113, the clamping force of circuit board 102 can be strengthened. Although FIG. 6 shows only the construction of fixed clamp 103, movable clamp 104 is constructed in the same way.

Figure 7:
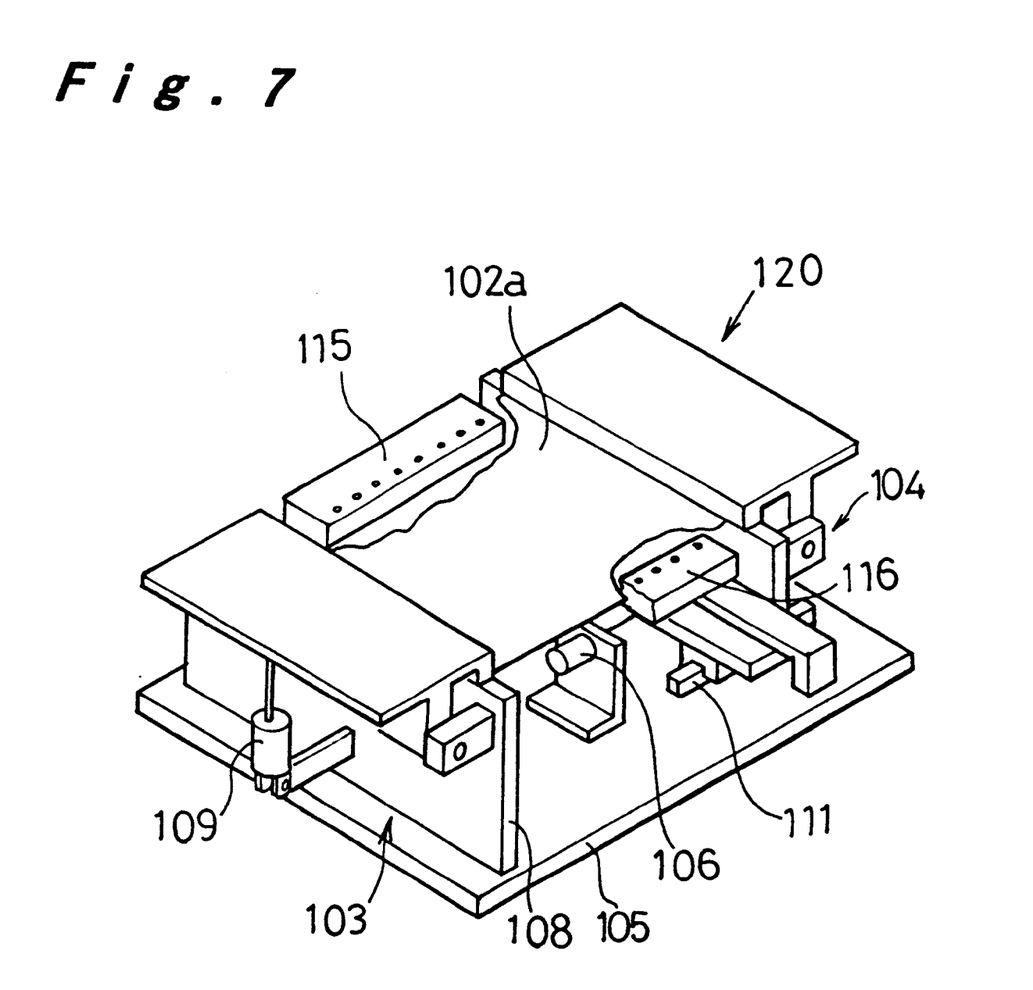
FIG. 7 is a perspective view showing the construction of a laser processing device according to a second embodiment of the present invention.

FIG. 7 is a perspective view showing the construction of a laser processing device 120 according to a second embodiment for coping with sheet-form articles to be processed which are of large size. Elements that are common to the construction of the first embodiment are given the same reference numerals and further description is omitted.

In laser processing device 120, in addition to the structure of the first embodiment, there are provided vacuum suction units 115, 116 for holding the periphery of sheet-form circuit board 102a where it is not clamped. Thus, a circuit board 102a of large size can be held in stable fashion and can easily be set in the required processing position. In cases where distortion would be produced by simply holding under tension both ends of a circuit board 102a formed of thin resin sheet or formed of a metal sheet of large size, stable flatness can be maintained by this construction. Also, even when setting to effect location into the processing position, the setting operation can be facilitated by using vacuum suction units 115, 116 to temporarily hold circuit board 102a after it has been fed.

In the construction described above, a circuit board was chosen as the article to be processed, but application would also be possible to laser processing of other articles to be processed which are in the form of thin sheets. Also, in the case where the article to be processed is of a modified shape which is not rectangular, forming could be achieved by providing a plurality of pairs of fixed clamps 103 and movable clamps 104.

Figure 8:
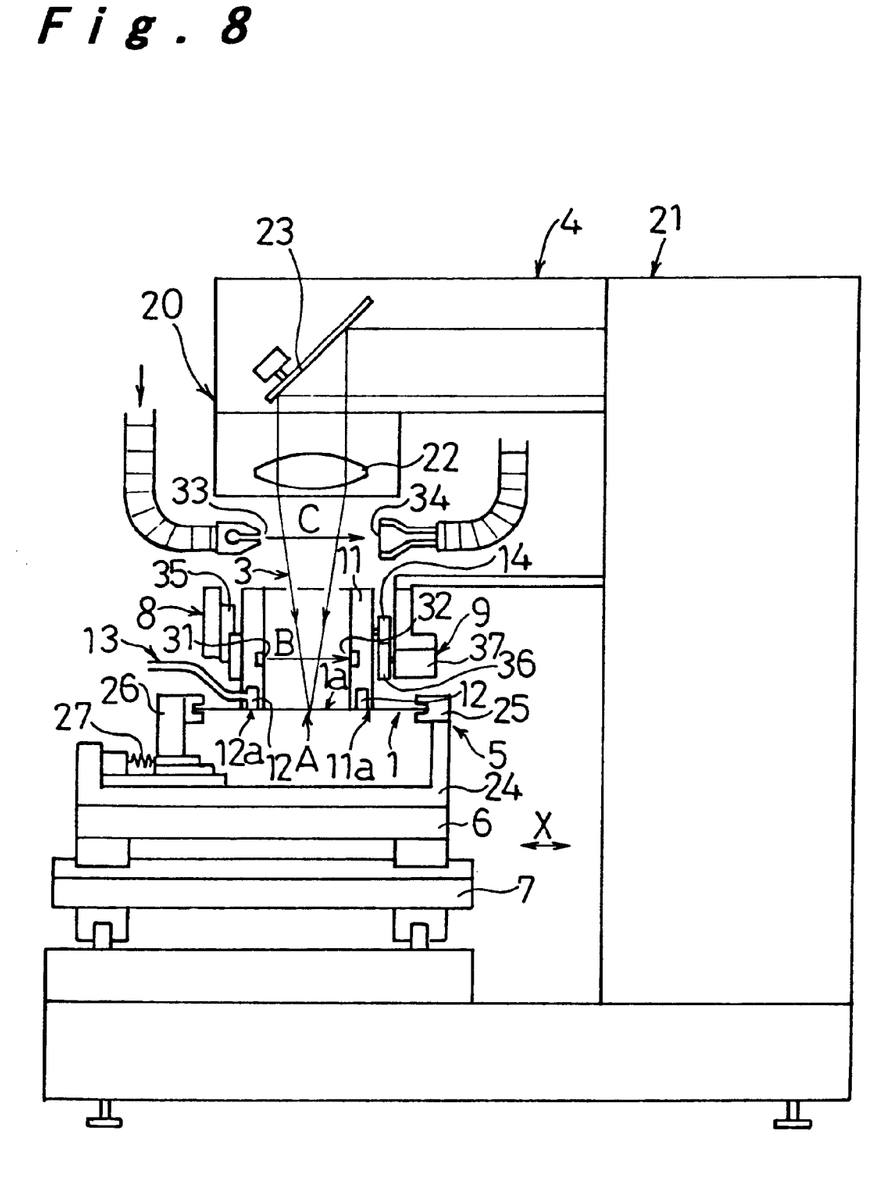
FIG. 8 is a front view showing the construction of a laser processing device in a third embodiment of the present invention.
Figure 9:
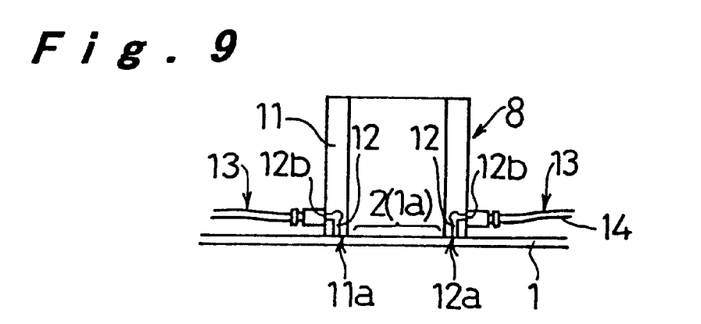
FIG. 9 is a front view of a suction device of this laser processing device.
Figure 10:
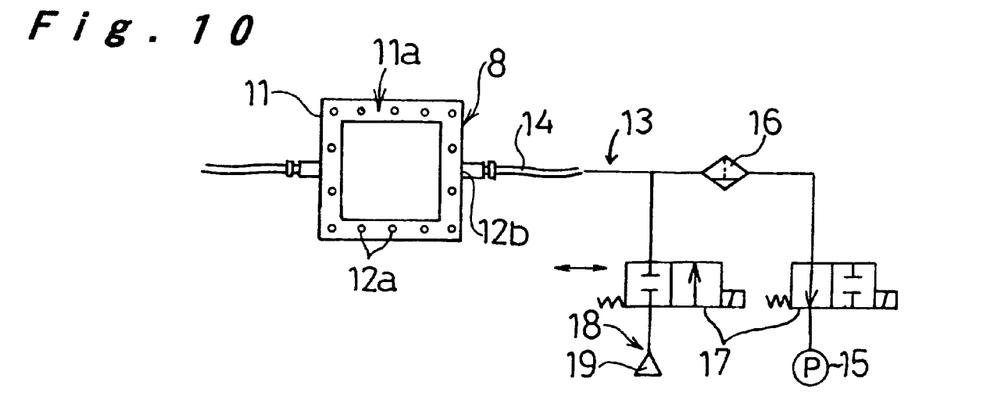
FIG. 10 is a bottom view thereof.

FIGS. 8 to 10 show a laser processing device according to a third embodiment of the present invention. This embodiment relates to a laser processing device in which processing using a laser beam is performed on the surface of a thin sheet made of resin that is employed in a multi-layer circuit board of an item of electrical equipment, for example.

As shown in FIGS. 8 to 11, this laser processing device comprises: a clamping device 5 for applying tension to thin sheet 1; a suction device 8 for releasably holding by suction the periphery of a demarcation portion 1a such that this demarcation portion 1a of sheet 1 is maintained in flat condition by this tension; a laser emitting device 4 for performing laser processing of demarcation portion 1a of thin sheet 1 that is supported by suction created by suction device 8; and displacement devices 6, 7 for relatively displacing thin sheet 1 with respect to this laser emission device 4 and suction device 8 such that each demarcation portion 1a of thin sheet 1 is successively subjected to laser processing.

An example of thin sheet 1 is a large flexible resin sheet of thickness 0.2–0.3 mm, size about 30 cm×60 cm. The size of the demarcation portion 1a is restricted to about 50 mm×50 mm, so that, within this range, the size and shape of the focal spot of focused laser beam 3 are uniform.

Laser beam emitting device 4 comprises a laser optical system 20 and a laser oscillator 21 that generates a laser beam 3 in pulse fashion synchronized with this laser optical system 20. Laser optical system 20 comprises a condensing lens 22 that focuses laser beam 3 and a galvano-scanner 23 that locates the focal point of laser beam 3 at the processing point A on thin sheet 1.

Clamping device 5 comprises a fixed clamp 25 that clamps sub-table 24 and one side of thin sheet 1 and that is fixed to this sub-table 24, and a movable clamp 26 that clamps one side opposite the aforesaid one side. Thin sheet 1 is stretched horizontally by means of a spring 27 that biases this movable clamp 26 such as to apply tension to thin sheet 1 in the X direction.

X table 6 and Y table 7 displace sub-table 24 such that it can be located in the X and Y directions. Thin sheet 1 is divided up into a plurality of demarcation portions 1a. Once processing of one demarcation portion 7a has been completed, position location is performed so as to introduce the next demarcation portion 1a into the suction zone of suction device 8.

Suction device 8, as shown in FIGS. 8 to 10, comprises a frame-shaped member 11 incorporating a plurality of conduits 12 that are mutually linked and that are provided with suction ports 12a on a frame-shaped end face 11a facing thin sheet 1, and a suction member 13 that sucks air and is connected to base end 12b of conduit 12. Thin sheet 1 can be secured by suction to the end face 11a of frame shaped member 11 with this frame shaped member 11 surrounding the periphery of each demarcation portion 1a of thin sheet 1 with the provision of a distance such that there is no interference with laser beam 3.

Suction member 13 comprises a hose 14 connected to base end 12b of frame member 11 and a vacuum pump 15 connected through a changeover valve 17 and filter 16 to this hose 14. Changeover valve 17 is connected to a blowing member 18 comprising a compressor 19 that blows compressed air into it, and selectively connects one or other of suction member 13 and blowing member 18 with conduit 12 through hose 14.

An example of frame-shaped member 11 consists of a square frame having a rectangular frontage of about 6 cm×6 cm. Conduits 12 are constituted with the provision of a plurality of suction portions 12a of diameter 1 mm and a pitch about 1 cm in its end face 11a and having width of about 1 cm. All these conduits 12 are connected with the interior of frame-shaped member 11 and are gathered into two aperture portions provided on the outside of frame shaped member 11, these constituting the base ends 12b of all the conduits 12. By using suction member 13 to suck air from all the suction ports 12a, thin sheet 1 is sucked onto its end face 11a. By using blowing member 18 to blow air from all the suction ports 12a, any processing waste that has been sucked into this conduit 12 and/or processing waste that has accumulated on the suction surface of thin sheet 1 can be blown away and removed.

Figure 11:
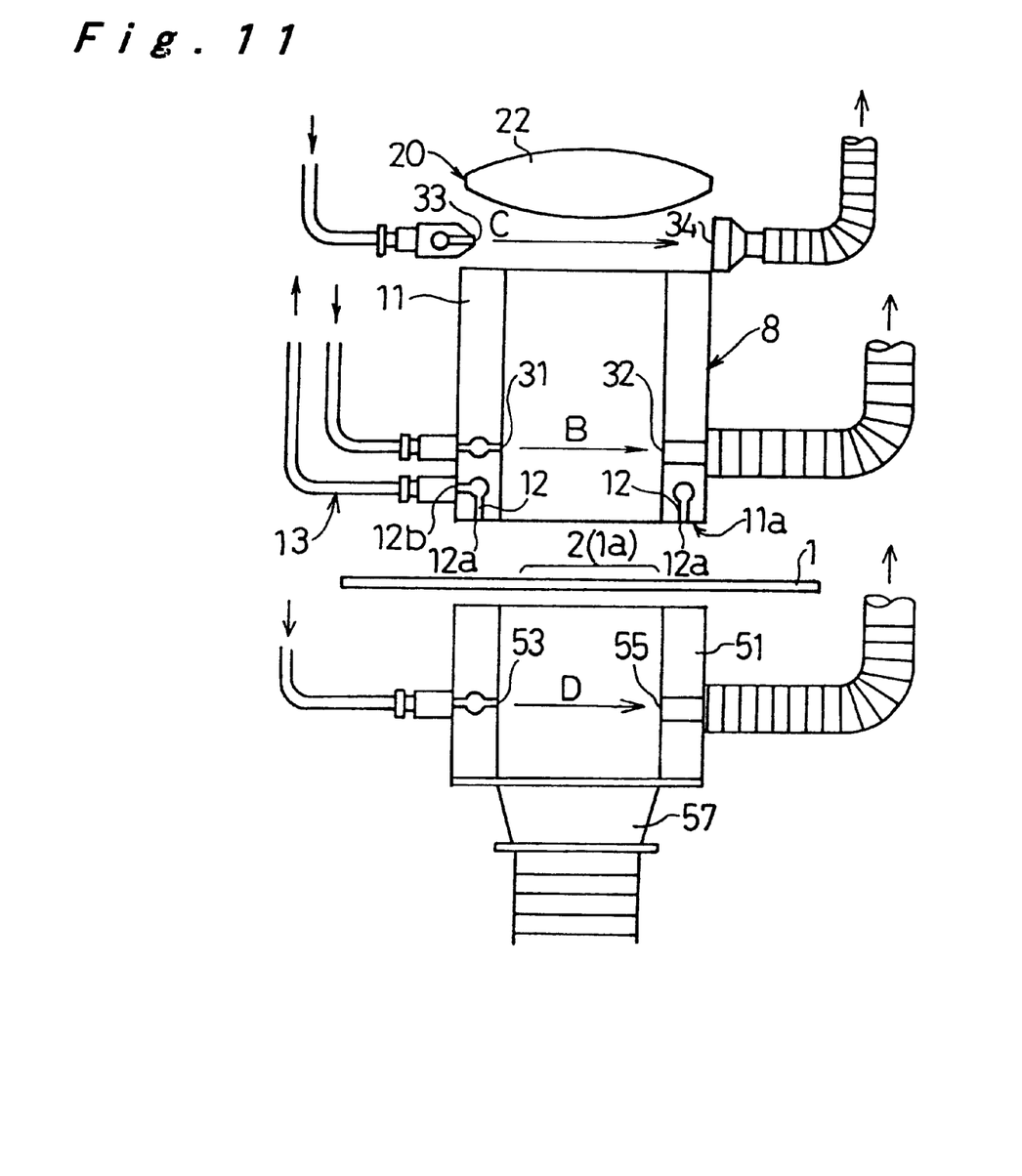
FIG. 11 is a front view showing the overall construction of the suction device of this laser processing device.

Also, as shown in FIGS. 8 and 11, in this frame-shaped member 11 there are arranged in parallel a blowing port 31 in the inside wall surface on one side thereof and an air suction port 32 in the inside wall surface facing this inside wall surface so that a powerful flow B of compressed air from blowing port 31 to suction port 32 is formed by an air blowing member, not shown, connected to the base end of blowing port 31 and an air suction member, not shown, connected to the base end of suction port 32, thereby removing and collecting from thin sheet 1 processing waste generated by laser processing. Also, between frame-shaped member 11 and condensing lens 22, a second blowing port 33 and second suction port 34 are arranged in parallel facing each other on either side of the scanning laser beam path so that a powerful flow C of compressed air is formed from second blowing port 33 to second suction port 34 by means of an air blowing member, not shown, connected to the base end of second blowing port 33 and an air suction member, not shown, connected to the base end of the second suction port 34 so that processing waste generated by laser processing is removed and collected without attaching itself in laser optical system 20.

Especially when the article to be processed is a thin sheet made of resin such as aramid epoxy resin, the resin waste must be collected immediately because the drop-like resin waste melted by heat with the laser beam that is generated during laser processing becomes hard to be removed when stuck to other members in the vicinity after being cooled down and set. For that purpose, there is further provided a lower frame-shaped member 51 in this embodiment, at a position opposite to the suction device 8 below the thin sheet 1 as shown in FIG. 11. The lower frame-shaped member 51 has a waste-collecting duct 57 downwardly connected thereto, by which the processing waste of relatively great size falling downward by its own weight can be swiftly collected. Further, the lower frame-shaped member 11 has a blowing port 53 in the inside wall surface on one side thereof and an air suction port 55 in the inside wall surface facing this inside wall surface so that a powerful flow D of compressed air from blowing port 53 to suction port 55 is formed by an air blowing member (not shown) connected to the base end of blowing port 53 and an air suction member (not shown) connected to the base end of suction port 55, thereby immediately removing and collecting smaller processing waste generated below the thin sheet 1.

In the case where the article to be processed is a metal sheet, the lower frame-shaped member 51 described above may not necessarily be provided, as the waste removing can be achieved to a desired extent with the blowing port 31, the suction port 32, the second blowing port 33, and the second suction port 34.

As shown in FIG. 8, locating member 9 comprises: a linear guide 35 that holds frame-shaped member 11 such that it can be displaced perpendicularly with respect to the surface of thin sheet 1; eccentric cam 36 that contacts cam follower 14 and that is arranged outside frame-shaped member 11; and a servo motor 37 that drives this eccentric cam 36, thereby reliably effecting approach and separation between frame-shaped member 11 and thin sheet 1. During laser processing, end face 11a to which thin sheet 1 has been attached by suction is located at the working distance of laser beam 3. Also, in this separated position, when thin sheet 1 is moved using X table 6 and Y table 7, in this separated position, movement of thin sheet 1 can be effected at high speed using X table 6 and Y table 7 without damaging thin sheet 1 by frame-shaped member 11.

A method of laser processing thin sheet 1 using the above construction is described below.

First of all, thin sheet 1 is stretched horizontally by means of clamping device 5 and a single demarcation portion 1a is located in position below frame-shaped member 11 by using X table 6 and Y table 7 to displace thin sheet 1 in the X and Y directions. End face 11a of frame-shaped member 11 is located at the working distance of laser beam 3 by means of locating member 9 and thin sheet 1 is thereby fixed by suction on this end face 11a by putting suction member 13 in suction condition. Galvano-scanner 23 then rapidly locates the focal point of laser optical system 20 in position and arrests it at the desired processing point A in the located demarcation portion 1a and, simultaneously with this, laser beam 3 from laser oscillator 21 is generated in pulsed fashion, instantaneously forming a hole at this processing point A and then immediately shifting to processing operation at the next processing point A.

When processing of a single demarcation portion 1a of thin sheet 1 has been completed, frame-shaped member 11 is separated from the suction face of thin sheet 1 by locating member 9, and thin sheet 1 is then moved and located in position by X table 6 and Y table 7. Changeover valve 17 is then changed over so that any processing waste that has been sucked into conduit 12 and/or any processing waste deposited on the suction face of thin sheet 1 is blown away by blowing member 18. Processing then moves on to the next demarcation portion 1a. Processing to form minute holes at desired processing points A of a thin sheet 1 of small thickness and large area can thus be performed precisely by means of laser beam 3.

In the above embodiment, resin sheet material was employed as thin sheet 1 but the present invention is not restricted to this and could also be applied to ultra-thin metal foil or paper or resin either alone or as composite sheet material obtaining by sticking such materials together.

Although in the embodiments described above, processing of thin sheet 1 was effected using a pulsed laser beam 3, the present invention is not restricted to this and laser processing of various kinds could be performed such as welding or image fixing by setting various appropriate intensities or generation patterns of the laser beam.

Figure 12:
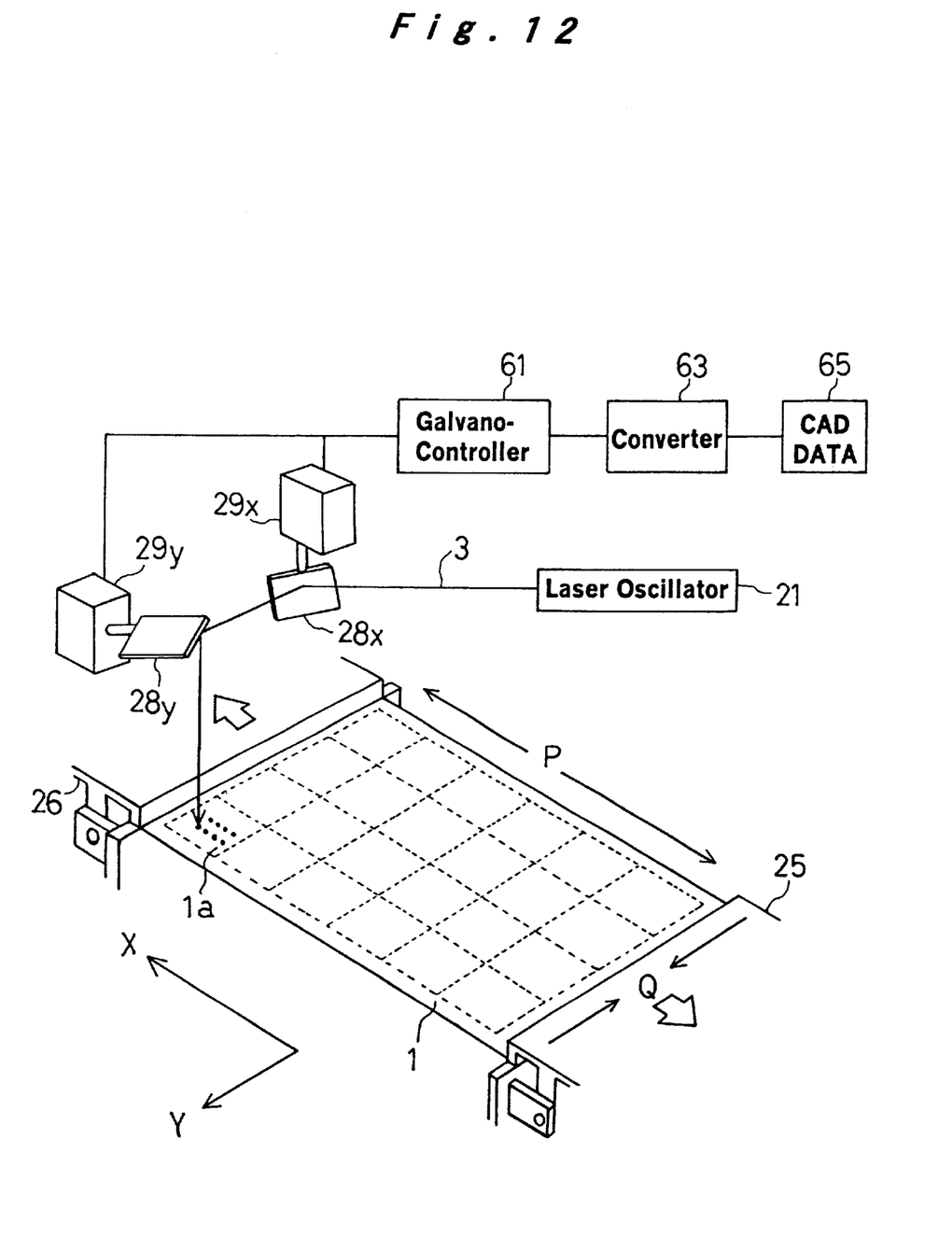
FIG. 12 is a schematic view showing primary parts of the laser processing device according to a fourth embodiment of the present invention.

A fourth embodiment of the present invention will be hereinafter described which is shown in FIG. 12. In FIG. 12, only primary parts of the laser processing device are shown for the purpose of explanation, and the illustration and description of other elements are omitted as they are substantially identical to those of the embodiments described above.

In any of those above-described embodiments, when the article to be processed is a thin sheet made of resin, the tension applied to both ends of the resin sheet in a direction away from each other causes elongation in the resin sheet because of its resiliency. Since the resin sheet is processed under a state stretched in a flat condition, the points that have been laser-processed slightly displace when the resin sheet is released from the tension and resiled. In this embodiment, for further enhancing the processing accuracy, the amount of displacement of processing points caused by resiliency in the resin sheet is preliminarily calculated, according to which the data for controlling the processing points are corrected, and laser processing is performed to the resin sheet held with a tensioning device in a flat condition based on the corrected processing point data.

More specifically, provided that tension F is applied to a resin sheet having a Young's modulus E, a maximum amount of elongation λ in the resin sheet can be expressed as:

$$\lambda = L \cdot F / A \cdot E (A = W \cdot T)$$

where L is length, W is width, and T is thickness of the resin sheet.

For example, when the resin sheet having a dimension of L=510 mm, W=340 mm, and T=0.13 mm is given the tension F of 13.5 kgf in a lengthwise direction P such that both ends of the resin sheet are stretched apart from each other, the maximum amount of elongation λ=135 mm in the lengthwise direction P is obtained by entering into the equation the Young's modulus E=1153 kgf/mm². Similarly, a maximum amount of shrinkage ρ at this time in a widthwise direction Q of the resin sheet can be obtained.

The maximum amount of elongation λ and the maximum amount of shrinkage ρ of the resin sheet achieved as described above are inputted to the CAD data 65 as correction values, which are then converted by a converter 63 to processing data for controlling the actual processing points by calculating out the processing points after displacement using the maximum elongation and shrinkage amounts λ and ρ. Galvano-controller 61 controls galvanometers 29x and 29y for X-axis and Y-axis adjustment, respectively, based on the data from the converter 63. The galvanometers 29x and 29y drive their respective X-axis and Y-axis galvano-mirrors 28x and 28y.

As set forth above, the resin sheet is not only maintained in a flat condition with the tensioning device and suction device, but also processed according to corrected processing point data by preliminarily computing the amount of displacement of the processing points in the resin sheet caused by elongation and shrinkage of the resin sheet after being released from the tension. Laser processing can be thereby effected precisely at desired positions, further enhancing the laser processing accuracy.

What is claimed is:

1. A laser processing device in which laser processing is performed by directing a laser beam onto a thin sheet the laser processing device comprising:

a clamping device that applies tension across at least a partial area expanse of the thin sheet;

a suction device that applies suction and holds, in a releasable manner, a side portion at at least two locations of a periphery of a demarcation portion, said demarcation portion being an area subdivision of said partial area expanse, such that a flat condition of said demarcation portion of the thin sheet is maintained due to the tension applied by said clamping device;

a laser beam emitting device that performs laser processing of the demarcation portion of the thin sheet which is held by the suction applied by said suction device; and a displacement device which displaces the thin sheet relative to said laser beam emission device and said suction device, such that each demarcation portion of the thin sheet is successively subjectable to laser processing.

2. The laser processing device according to claim 1, wherein said suction device comprises:

a frame-shaped member including a frame-shaped end face facing the thin sheet and mutually communicating conduits provided with suction ports at said frame-shaped end face and a suction generator that sucks air and that is connected to base ends of the conduits.

3. The laser processing device according to claim 2, wherein said suction device comprises:

a changeover valve that is connected between the base ends of the conduits of said frame-shaped member and said suction member; and a blower connected to said changeover valve and which blows air into said changeover valve, said changeover valve being constructed to effect selective connection of one of said suction member and said blower with the conduits.

4. The laser processing device according to claim 2, further comprising a position locating member that movably locates said frame-shaped member in position in a perpendicular direction with respect to the article to be processed.

5. The laser processing device according to claim 2, further comprising:

a blowing port provided on an inside wall face of said frame-shaped member;

a suction port provided on another inside wall face of said frame-shaped member facing said blowing port;

an air blowing member connected to the base end of said blowing port; and an air suction member connected to the base end of said suction port.

6. The laser processing device according to claim 2, further comprising:

a blowing port and suction port arranged in parallel opposite to each other on either side of a laser optical path between the frame-shaped member and a laser optical system;

an air blowing member connected to the base end of said blowing port; and an air suction member connected to the base end of said suction port.

* * * * *